(12) United States Patent
Huang et al.

(10) Patent No.: US 7,885,071 B2
(45) Date of Patent: Feb. 8, 2011

(54) HEAT DISSIPATION ARRANGEMENT FOR COMMUNICATION CHASSIS

(75) Inventors: Chiu-Mao Huang, Sinjhuang (TW); Chang-Moou Huang, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 58 days.

(21) Appl. No.: 12/409,875

(22) Filed: Mar. 24, 2009

(65) Prior Publication Data

US 2010/0208430 A1 Aug. 19, 2010

(30) Foreign Application Priority Data

Feb. 13, 2009 (TW) ................. 98202143 U

(51) Int. Cl.
*H05K 7/20* (2006.01)
(52) U.S. Cl. .................. 361/700; 361/679.47; 361/704; 361/710; 361/719; 165/104.21; 165/104.33; 174/15.2; 174/16.3
(58) Field of Classification Search ............ 361/679.47, 361/679.52, 700, 702, 704, 710, 717, 718, 361/719
See application file for complete search history.

(56) References Cited

U.S. PATENT DOCUMENTS

| | | | | |
|---|---|---|---|---|
| 5,283,715 A * | 2/1994 | Carlsten et al. ............. | 361/702 |
| 5,398,161 A | 3/1995 | Roy | |
| 6,205,022 B1 * | 3/2001 | Bhatia et al. ........... | 361/679.52 |
| 6,418,017 B1 * | 7/2002 | Patel et al. .................. | 361/700 |
| 6,958,910 B2 * | 10/2005 | Tanaka et al. ............... | 361/699 |
| 7,130,193 B2 * | 10/2006 | Hirafuji et al. .............. | 361/700 |
| 7,277,282 B2 * | 10/2007 | Tate ........................... | 361/697 |
| 7,304,846 B2 * | 12/2007 | Wang et al. ................. | 361/700 |
| 7,732,916 B2 * | 6/2010 | Hasegawa ................... | 257/707 |
| 2008/0158820 A1 * | 7/2008 | Peng et al. .................. | 361/703 |

* cited by examiner

*Primary Examiner*—Jayprakash N Gandhi
*Assistant Examiner*—Courtney Smith

(57) ABSTRACT

A heat dissipation arrangement for communication chassis includes a chassis body defining an inner receiving space and being divided into at least one heat receiving portion and at least one heat dissipation portion; a first heat pipe set arranged in the receiving space to connect the heat receiving portion to the heat dissipation portion, so that heat absorbed by the heat receiving portion can be quickly transferred via the first heat pipe set to the heat dissipation portion; and at least one thermal module including a plurality of radiating fins and at least one second heat pipe, which is connected to the heat dissipation portion and extended through the radiating fins, allowing part of the heat transferred to the heat dissipation portion to be transferred to the radiating fins. The thermal module provides additional heat dissipating area, so that the communication chassis can provide excellent heat dissipation effect.

10 Claims, 6 Drawing Sheets

HEAT DISSIPATION ARRANGEMENT FOR COMMUNICATION CHASSIS

FIELD OF THE INVENTION

The present invention relates to a heat dissipation arrangement for communication chassis, and more particularly to a heat dissipation arrangement for communication chassis that includes at least one thermal module to provide additional heat dissipating area, enabling heat in the communication chassis to be quickly dissipated into ambient air.

BACKGROUND OF THE INVENTION

It is known that electronic communication equipment is conventionally enclosed in a communication chassis. When the electronic devices of the communication equipment operate, heat is produced at the same time. The communication chassis is a closed enclosure generally made of a metal material through one-step cast-molding process. However, being limited by the currently available casting techniques, the metal communication chassis usually has relatively low heat conductivity. As a result, heat produced by the electronic devices during operation thereof tends to accumulate in and concentrated at some particular areas of the communication chassis. The accumulated heat results in a relatively high temperature at these areas and can not be easily dissipated from the closed communication chassis. When the temperature exceeds the range that can be accepted by the electronic devices of the communication equipment, the reliability or service life of the communication equipment would be seriously adversely affected. However, for other areas in the communication chassis farther away from the heat-producing electronic devices, the temperature is much lower than that in those areas closer to or contacting with the electronic devices of the communication equipment. That is, the temperature distribution in the conventional communication chassis is extremely uneven to largely reduce an overall heat dissipation performance of the whole communication chassis. The currently available solutions for the above problems generally include enlarging an internal space of the communication chassis and improving the communication chassis material. However, these solutions would inevitably result in a bulky and heavy communication chassis.

It is therefore important to work out a way that can enhance the heat dissipation performance of the communication chassis without increasing its dimensions and weight.

FIG. 1 is an exploded perspective view of a conventional communication chassis, which includes a chassis body 10, a cover 11, a plurality of supporting posts 12, and a machine board 13. The chassis body 10 defines an inner receiving space 101, and is provided on an outer surface opposite to the receiving space 101 with a plurality of radiating fins 103. The supporting posts 12 are arranged in the receiving space 101 adjacent to one side of the chassis body 10. The machine board 13 has a plurality of heat-producing electronic elements 131 mounted thereon and is connected to and accordingly supported on a top of the supporting posts 12. The cover 11 can be fitted in the receiving space 101 to cover the machine board 13.

The heat-producing elements 131 can include, for example, different chips, a central processing unit (CPU), and other integrated circuits (ICs). When these heat-producing elements 131 on the machine board 13 operate in the communication chassis, a large amount of high-temperature heat is produced. The produced heat is accumulated in the receiving space 101 and could not be quickly dissipated therefrom. The accumulated heat can only be transferred to the chassis body 10 via heat radiation. And only some part of the heat transferred to the chassis body 10 can be radiated from the radiating fins 103 on the chassis body 10 to dissipate outward. Since the heat-producing elements 131 on the machine board 13 are not in contact with any other heat conducting media, such as heat pipes or other heat-conducting elements, the heat produced by the heat-producing elements 131 could not be quickly transferred to the radiating fins 103 for dissipation. As a result, the heat in the communication chassis could not quickly diffuse outward and tends to damage the heat-producing elements 131 and interrupt computing process of the electronic communication equipment, resulting in poor communication signal quality. In some worse conditions, the heat-producing elements 131 would be burned-out or have shortened service life.

According to the above description, the conventional communication chassis has the following disadvantages: (1) having poor heat dissipation effect; (2) easy to cause abnormal operation of the electronic communication equipment; (3) tending to cause poor communication signal quality; (4) tending to shorten the service life of the electronic communication equipment; and (5) having high damage rate.

It is therefore tried by the inventor to develop a heat dissipation arrangement for communication chassis to overcome the problems in the conventional communication chassis.

SUMMARY OF THE INVENTION

A primary object of the present invention is to provide a heat dissipation arrangement for communication chassis that includes at least one thermal module to achieve excellent heat dissipation effect.

Another object of the present invention is to provide a heat dissipation arrangement for communication chassis that provides additional heat dissipating area.

A further object of the present invention is to provide a heat dissipation arrangement for communication chassis that is helpful in maintaining stable communication signal quality.

A still further object of the present invention is to provide a heat dissipation arrangement for communication chassis that enables the communication equipment in the communication chassis to have extended service life.

To achieve the above and other objects, the heat dissipation arrangement for communication chassis according to a preferred embodiment of the present invention includes a chassis body, at least one thermal module, and a first heat pipe set. The chassis body defines an inner receiving space and is divided into at least one heat receiving portion and at least one heat dissipation portion. The first heat pipe set is installed on the chassis body and located in the receiving space to extend between and connect to the heat receiving portion and the heat dissipation portion, so that heat absorbed by the heat receiving portion can be transferred to the heat dissipation portion. The thermal module includes a plurality of radiating fins and at least one second heat pipe. The second heat pipe connects the chassis body to the radiating fins, so that heat transferred to the chassis body is brought by the second heat pipe to the thermal module for dissipation. The thermal module not only enables quick heat dissipation, but also provides additional heat dissipating area. Therefore, the communication chassis can provide excellent heat dissipation effect.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
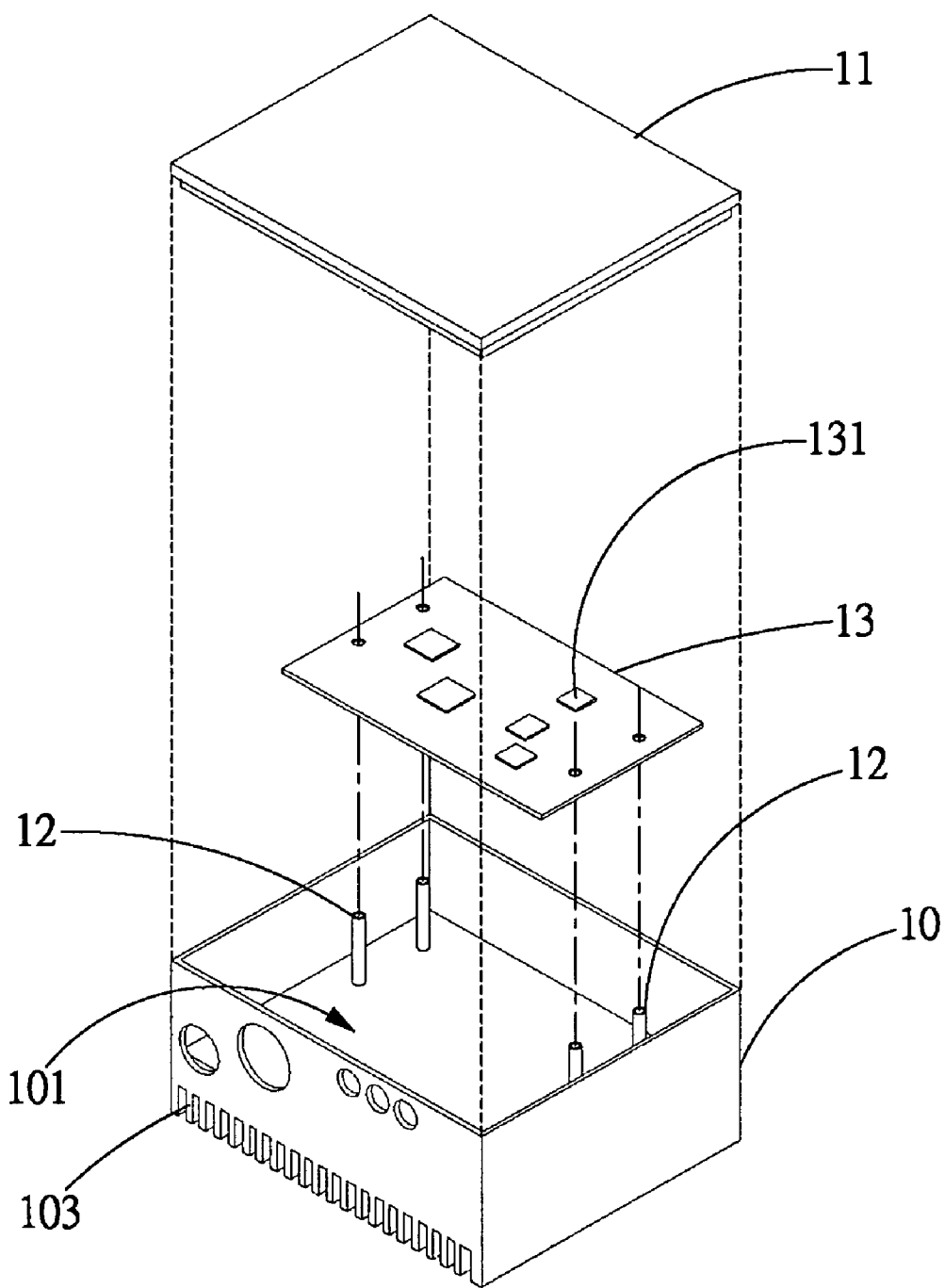
FIG. 1 is an exploded perspective view of a conventional communication chassis.
Figure 2:
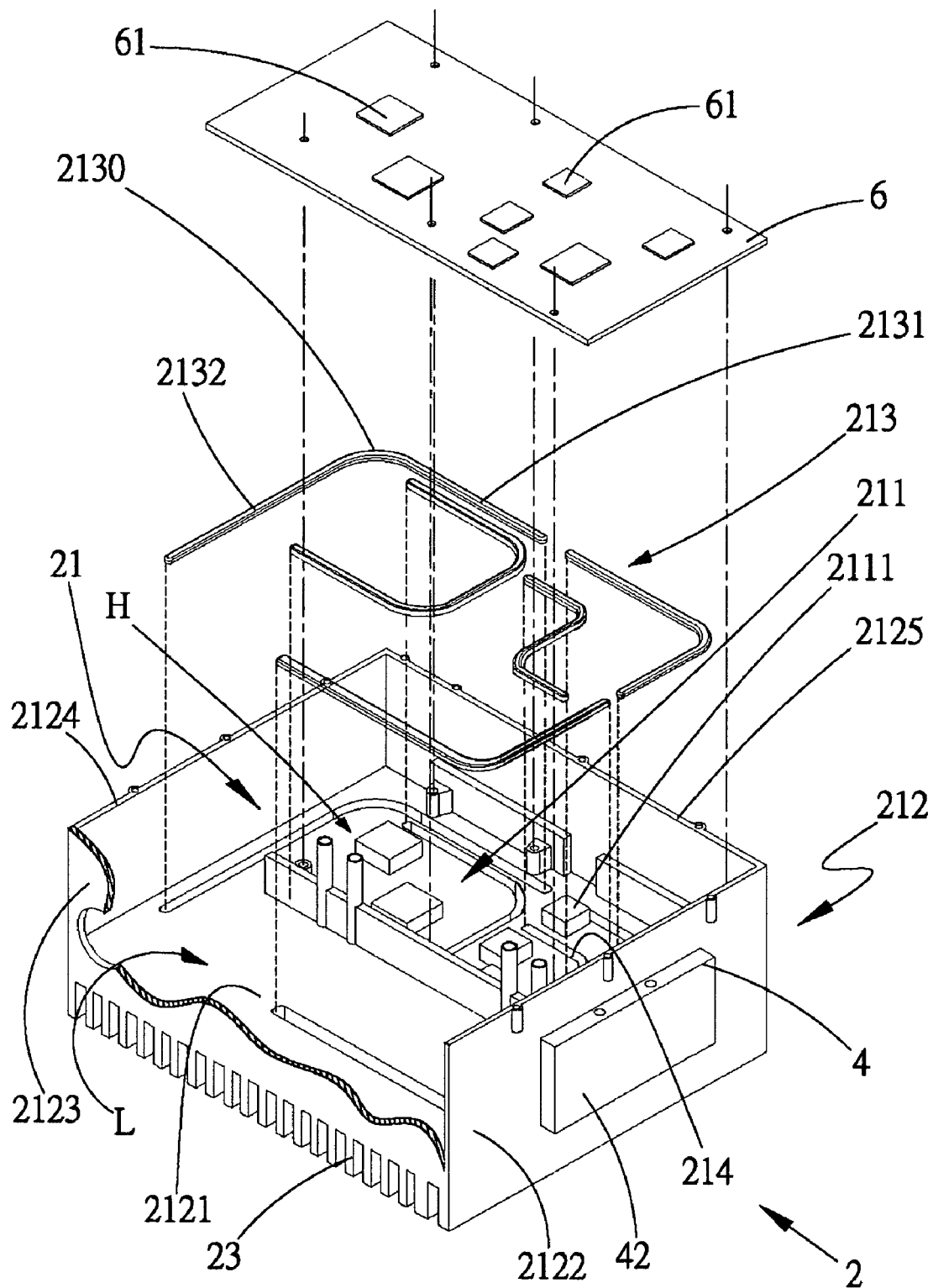
FIG. 2 is an exploded perspective view of a chassis body included in a heat dissipation arrangement for communication chassis according to the present invention.
Figure 6:
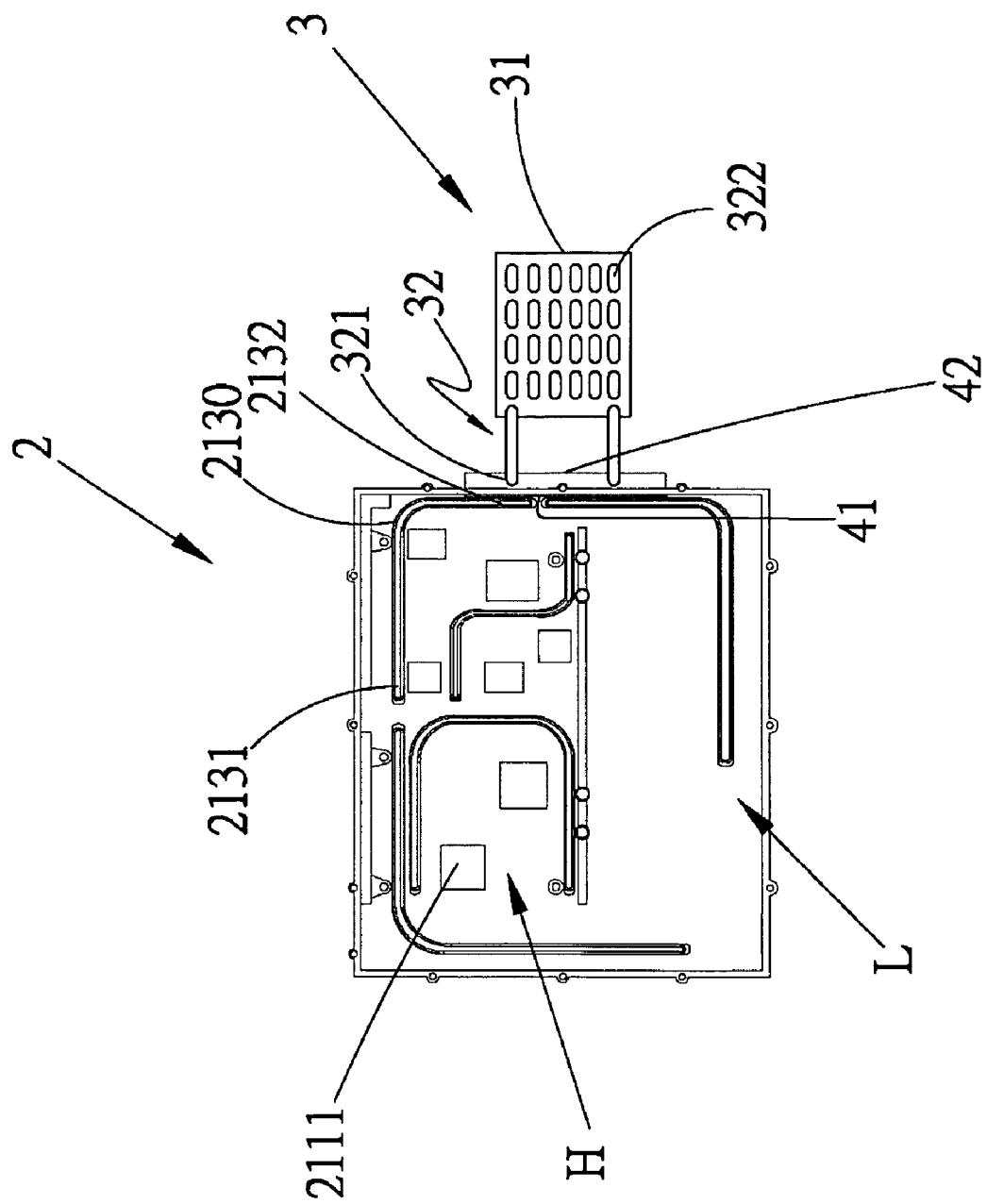
FIG. 6 is a top view of the heat dissipation arrangement for communication chassis according to the preferred embodiment of the present invention.

Please refer to FIGS. 2 and 6. A heat dissipation arrangement for communication chassis according to a preferred embodiment of the present invention includes a chassis body 2 and at least one thermal module 3. The chassis body 2 defines an inner receiving space 21 therein and has a plurality of radiating fins 23 provided on an outer surface facing away from the inner receiving space 21. The chassis body 2 is divided into at least one heat receiving portion 211 and at least one heat dissipation portion 212. A first heat pipe set 213 is arranged in the receiving space 21 to extend between and connect to the heat receiving portion 211 and the heat dissipation portion 212, allowing heat absorbed by the heat receiving portion 211 to be transferred to the heat dissipation portion 212 via the first pipe set 213.

The thermal module 3 includes a plurality of radiating fins 31 and at least one second heat pipe 32. The second heat pipe 32 extends between and connects to the chassis body 2 and the plurality of radiating fins 31, so that heat transferred to the chassis body 2 can be brought by the second heat pipe 32 to the thermal module 3 for dissipation. The second heat pipe 32 has a second heat absorbing end 321 and a second heat dissipating end 322. The second heat absorbing end 321 is connected to one side of the chassis body 2, and the second heat dissipating end 322 is extended through the radiating fins 31. With these arrangements, heat transferred to first heat dissipating ends 2132 of the first heat pipe set 213 can be quickly conducted to the second heat absorbing end 321 of the at least one second heat pipe 32, and then further guided from the second heat absorbing end 321 to the second heat dissipating end 322 and accordingly, the radiating fins 31 connected to the second heat dissipating end 322.

The first heat pipe set 213 includes a plurality of first heat pipes 2130, which each have a first heat absorbing end 2131 and a first heat dissipating end 2132. Heat absorbed by the first heat absorbing ends 2131 is transferred to the first heat dissipating ends 2132 through heat conduction via the first heat pipes 2130. In other words, the first heat absorbing ends 2131 quickly transfer the heat absorbed by the heat receiving portion 211 to the first heat dissipating ends 2132. The first heat dissipating ends 2132 guide most part of the received heat to the thermal module 3 externally connected to the chassis body 2 for quick heat dissipation. The remaining part of the heat received by the first heat dissipating ends 2132 is transferred to the heat dissipation portion 212. Therefore, the first heat pipe set 213 can effectively collect heat in the communication chassis and bring the collected heat to the thermal module 3 and the heat dissipation portion 212 to achieve the purpose of quick heat dissipation.

Figure 3:
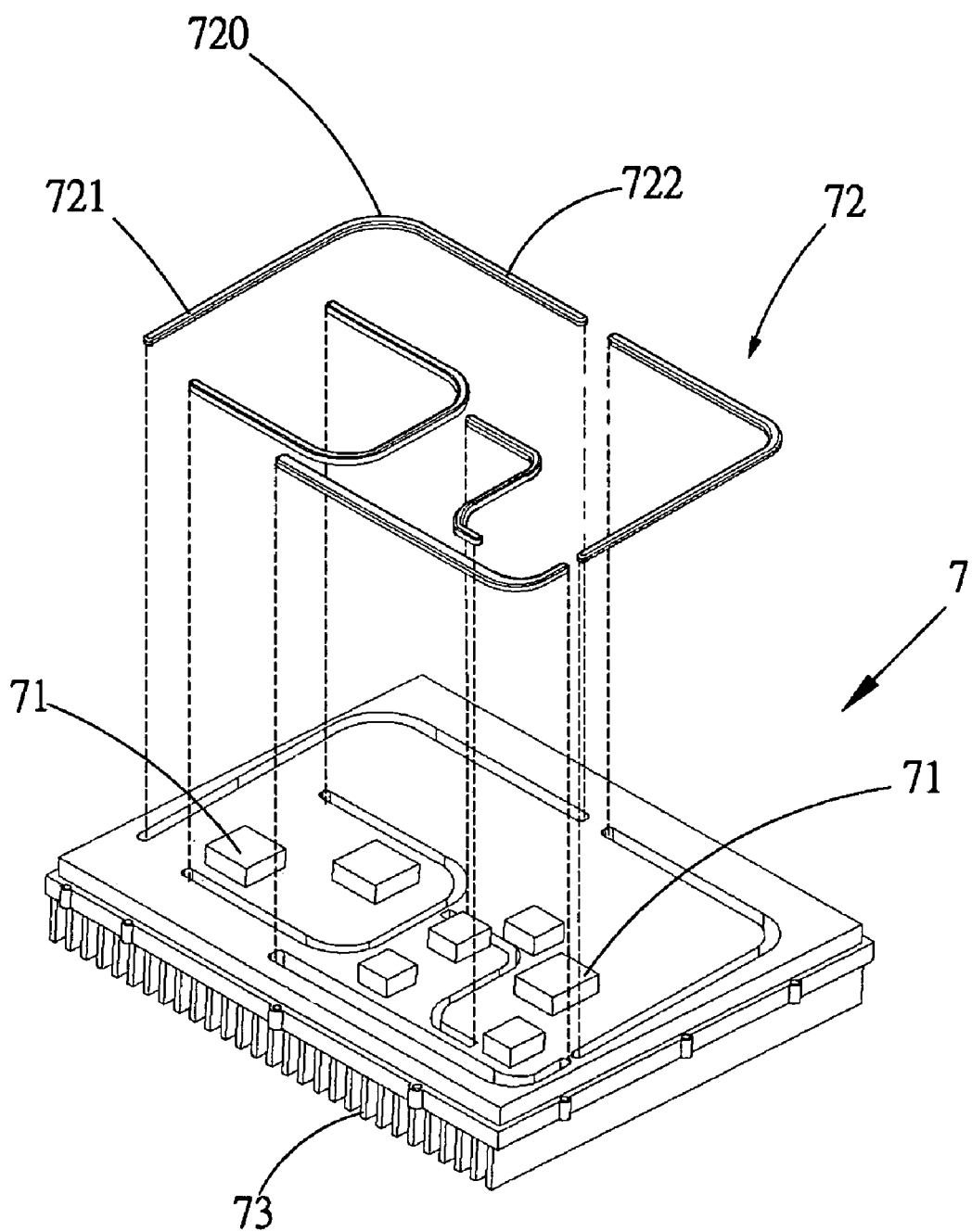
FIG. 3 is an exploded perspective view of a cover included in the heat dissipation arrangement for communication chassis according to the present invention.
Figure 4:
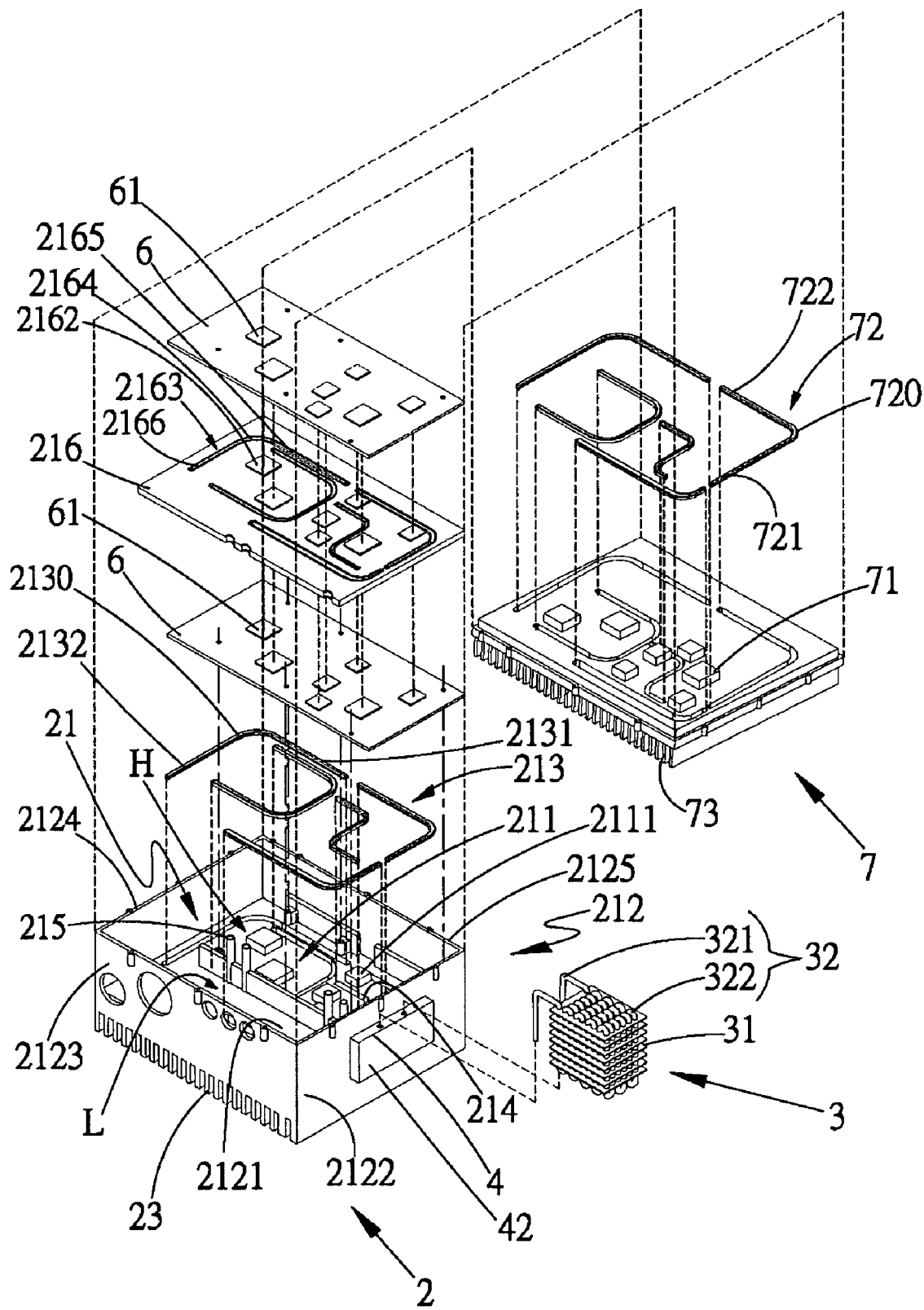
FIG. 4 is an exploded perspective view of the heat dissipation arrangement for communication chassis according to a preferred embodiment of the present invention.
Figure 5:
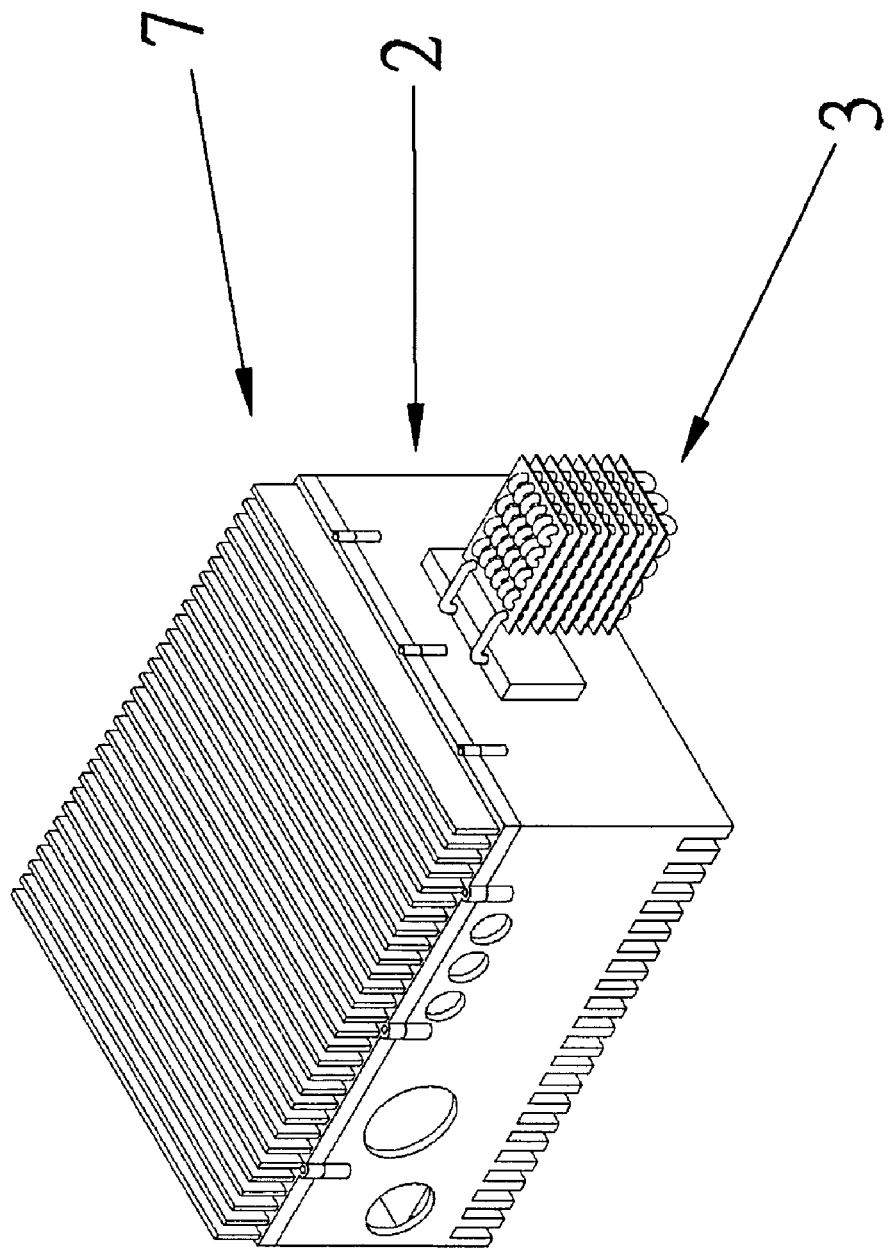
FIG. 5 is an assembled view of FIG. 4.

FIGS. 4 and 5 are exploded and assembled perspective views, respectively, of the heat dissipation arrangement for communication chassis according to the preferred embodiment of the present invention, FIG. 3 is an exploded perspective view of a cover included in the heat dissipation arrangement for communication chassis of FIG. 4, and FIG. 6 is a top view of the heat dissipation arrangement for communication chassis of the present invention. Please refer to FIGS. 2, 3, 4, 5 and 6. The chassis body 2 is externally provided on at least one side corresponding to the at least one thermal module 3 with a heat-transfer portion 4, so that the thermal module 3 can be connected to the heat-transfer portion 4. The heat-transfer portion 4 includes at least one first conducting end 41 and at least one second conducting end 42. Heat transferred to the first heat pipe set 213 is conducted from the first conducting end 41 to the second conducting end 42 and then transferred to the thermal module 3. That is, heat received by the first heat dissipating ends 2132 of the first heat pipes 2130 is transferred from the first conducting end 41 to the second conducting end 42, and the second conducting end 42 guides heat collected thereat to the second heat absorbing end 321. Thereafter, the second heat absorbing end 322 further transfers the received heat to the second heat dissipating end 322, so that the heat can be uniformly distributed to the radiating fins 31 sequentially connected to the second heat dissipating end 322 and be quickly radiated into ambient air.

In the heat receiving portion 211, there is provided at least one first raised area 2111 for contacting with at least one heat-producing element 61 aligned therewith, so that a hot zone H is formed at the first raised area 2111. That is, when the first raised area 2111 absorbs heat produced by the heat-producing element 61, the first raised area 2111 becomes a high-temperature area in the receiving space 21 and thereby forms a hot zone H on the chassis body 2. It is noted the first heat absorbing ends 2131 are closer to the first raised area 2111 and the first heat dissipating ends 2132 are farther away from the first raised area 2111.

The heat dissipation portion 212 includes a first heat dissipation section 2121, a second heat dissipation section 2122, a third heat dissipation section 2123, a fourth heat dissipation section 2124, and a fifth heat dissipation section 2125. These heat dissipation sections 2121 to 2125 are connected to one another to constitute a cold zone L. The cold zone L is distant from the hot zone H without contacting with any heat-producing element 61, and therefore becomes a low-temperature heat dissipation area in the receiving space 21. In the illustrated preferred embodiment, the first heat dissipation section 2121 is a section on a bottom of the receiving space 21 opposite to and distant from the heat receiving portion 211. The second to the fifth heat dissipation section 2122-2125 are successively connected to one another to locate around the receiving space 21. In other words, the second heat dissipation section 2122 has two lateral edges separately connected to one lateral edge of the third heat dissipation section 2123 and the fifth heat dissipation section 2125, and the other lateral edge of the third and the fifth heat dissipation section 2123, 2125 are separately connected to two lateral edges of the fourth heat dissipation section 2124.

On an inner surface of the chassis body 2, there can be provided at least one groove 214 for receiving the first heat pipes 2130 therein. Apart of the at least one groove 214 is located adjacent to the at least one raised area 2111 and around the heat receiving portion 211, and the remaining part of the at least one groove 214 is located adjacent to the heat dissipation portion 212 and around the chassis body 2. In brief, a part of the at least one groove 214 for receiving the first heat absorbing ends 2131 of the first heat pipes 2130 is extended adjoining the at least one raised area 2111 and around the heat receiving portion 211, while the remaining part of the at least one groove 214 for receiving the first heat dissipating ends 2132 of the first heat pipes 2130 is located distant from the at least one raised area 2111 and in contact with the heat dissipation portion 212 and the chassis body 2. Moreover, at least one machine board 6 is held in the receiving space 21, and the at least one heat-producing element 61 is provided on the machine board 6. In the preferred embodiment illustrated in FIG. 4, two machine boards 6 are shown.

As can be seen from FIG. 4, there is also at least one support element 215 and at least one heat-conducting element 216 provided in the receiving space 21. The support element 215 is located in the receiving space 21 of the chassis body 2 for supporting the machine boards 6 thereon, so that the machine boards 6 can be stably held in the receiving space 21. Meanwhile, heat produced by the at least one heat-producing element 61 on the machine boards 6 can also be transferred via the at least one support element 215 to the chassis body 2 and finally radiates from the radiating fins 23 on the outer surface of the chassis body 2 into ambient air.

The heat-conducting element 216 is arranged between two adjacent machine boards 6 with one end tightly abutted on an inner surface of the chassis body 2. The heat-conducting element 216 is provided on two opposite faces with at least one second raised area 2162 each for contacting with the heat-producing elements 61 on the two adjacent machine boards 6, so that heat produced by the heat-producing elements 61 on the two machine boards 6 is transferred to and absorbed by the second raised areas 2162, and hot zones H are also formed on the heat-conducting element 216 at the second raised areas 2162.

On one face of the heat-conducting element 216, a third heat pipe set 2163 can be further provided. The third heat pipe set 2163 includes a plurality of third heat pipes 2164, each of which has a third heat absorbing end 2165 closer to the at least one second raised area 2162 and a third heat dissipating end 2166 farther away from the at least one second raised area 2162. The heat absorbed by the third heat absorbing ends 2165 can be transferred to the heat dissipation portion 212 via the third heat dissipating ends 2166. Therefore, heat produced by the heat-producing elements 61 and absorbed by the second raised areas 2162 is transferred from the third heat-absorbing ends 2165 to the third heat-dissipating ends 2166, and the third heat-dissipating ends 2166 further transfer the received heat to the heat dissipation portion 212, so that the heat is radiated from the heat dissipation portion 212 and dissipated into surround air. The radiating fins 23 on the outer surface of the chassis body 2 also assist in radiating the heat transferred to the chassis body 2. More specifically, most part of the heat transferred to the chassis body 2 is dissipated through radiation from the first to the fifth heat dissipation section 2121~2125 as well as heat exchange with cool ambient air, while the remaining part of the heat is dissipated via the radiating fins 23 on the chassis body 2.

The heat dissipation arrangement for communication chassis according to the present invention further includes a cover 7 correspondingly connected to an open side of the chassis body 2. As can be seen from FIGS. 3, 4 and 5, the cover 7 has a first face facing toward the receiving space 21 and a second face facing away from the receiving space 21. The cover 7 is provided on the first face with at least one third raised area 71 and at least one fourth heat pipe set 72, and on the second face with a plurality of radiating fins 73. The third raised area 71 is in contact with the at least one heat-producing element 61 provided on the at least one machine board 6 to absorb heat produced by the heat-producing element 61, so that a hot zone H is formed at the third raised area 71.

The fourth heat pipe set 72 includes a plurality of fourth heat pipes 720, each of which has a fourth heat absorbing end 721 closer to the third raised area 71 and a fourth heat dissipating end 722 farther away from the third raised area 71. The fourth heat absorbing ends 721 can absorb heat and transfer the absorbed heat via the fourth heat dissipating ends 722 to the radiating fins 73 on the second face of the cover 7 and/or the heat dissipation portion 212. Therefore, the heat produced by the heat-producing element 61 and absorbed by the third raised area 71 is transferred from the fourth heat absorbing ends 721 to the fourth heat dissipating ends 722, and the fourth heat dissipating ends 722 further transfer the received heat to the heat dissipation portion 212 and the radiating fins 73 on the cover 7.

The function manner of the heat dissipation arrangement for communication chassis according to the preferred embodiment of the present invention will now be described with reference to FIGS. 4, 5, and 6.

During the operation thereof, the heat-producing elements 61 on the two machine boards 6 in the communication chassis will produce a large amount of heat. The first raised area 2111 on the heat receiving portion 211 absorbs the heat produced by the heat-producing element 61 on the machine boards 6, and the absorbed heat is transferred from the first heat absorbing ends 2131 of the first heat pipes 2130 to the first heat dissipating ends 2132. The first heat dissipating ends 2132 then guide the heat transferred thereto to the first conducting end 41 of the heat-transfer portion 4, and the first conducting end 41 conducts the heat to the second conducting end 42, so that the heat is further transferred from the second conducting end 42 to the second heat absorbing end 321 of the at least one second heat pipe 32. The second heat absorbing end 321 further brings the received heat to the second heat dissipating end 322, from where the heat is uniformly distributed to the radiating fins 31 and finally radiated into ambient air and dissipated. It is to be noted that most part of the heat transferred to the first heat dissipating ends 2132 is further transferred to the thermal module 3 and dissipated therefrom, while the remaining part of the heat transferred to the first heat dissipating ends 2132 is further transferred to the heat dissipation portion 212, that is, the first to the fifth heat dissipation sections 2121~2125.

Meanwhile, the second raised areas 2162 on the heat-conducting element 216 absorb the heat produced by the heat-producing elements 61 on the machine boards 6, and the third heat absorbing ends 2165 of the third heat pipes 2164 guide the heat from the second raised areas 2162 to the third heat dissipating ends 2166. The third heat dissipating ends 2166 further transfer the received heat to the heat dissipation portion 212. While a part of the heat transferred to the heat dissipation portion 212 is directly dissipated from the heat dissipation portion 212, the remaining part of the heat is brought by the first conducting end 41 to the second conducting end 42. The second conducting end 42 transfers the received heat to the second heat absorbing end 321 of the at least one second heat pipe 32, and the second heat absorbing end 321 further transfers the heat to the second heat dissipating end 322 and the radiating fins 31 connected thereto, so that the heat is radiated from the radiating fins 31 into ambient environment. Therefore, the thermal module 3 not only provides additional heat dissipating area, but also enables efficient removal of heat from the receiving space 21 and the chassis body 2, allowing the machine boards 6 in the communication chassis to operate stably and provide good and stable communication signal quality and enabling the communication chassis to have excellent heat dissipation performance.

In brief, the heat dissipation arrangement for communication chassis according to the present invention has the following advantages: (1) having improved heat dissipation performance; (2) providing additional heat dissipation area; (3) having enhanced heat conducting efficiency; (4) providing stable communication signal quality; and (5) enabling the communication equipment enclosed in the communication chassis to have extended usable life.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A heat dissipation arrangement for a communication chassis, comprising:
   a chassis body defining an inner receiving space and being divided into at least one heat receiving portion and at least one heat dissipation portion, wherein the heat receiving portion is provided with at least one first raised area for contacting with at least one heat-producing element and forming a hot zone at the first raised area wherein the receiving space has at least one machine board held therein and the at least one heat-producing element is provided on the machine board;
   at least one first heat pipe set being installed on the chassis body in the receiving space to extend between and connect to the heat receiving portion and the heat dissipation portion for transferring heat absorbed by the heat receiving portion to the heat dissipation portion;
   at least one thermal module consisting of a plurality of radiating fins and at least one second heat pipe, the second heat pipe being extended between and connected to the chassis body and the radiating fins, allowing heat transferred to the chassis body to be further transferred to the thermal module and dissipated into ambient air; and
   at least one support element and at least one heat-conducting element, the at least one support element being located in the receiving space of the chassis body for supporting the at least one machine board thereon, the at least one heat-conducting element being arranged between two adjacent machine boards, the heat-conducting element being provided on two opposite faces with at least one second raised area each, and the second raised areas contacting with the heat-producing elements on the two machine boards to form hot zones at the second raised areas.

2. The heat dissipation arrangement for a communication chassis as claimed in claim 1, wherein the at least one second heat pipe has a second heat absorbing end connected to one side of the chassis body and a heat dissipating end extended through the plurality of radiating fins.

3. The heat dissipation arrangement for a communication chassis as claimed in claim 1, wherein the chassis body is provided on at least one side corresponding to the thermal module with a heat-transfer portion for the thermal module to connect thereto; the heat-transfer portion having at least one first conducting end and at least one second conducting end; and the first conducting end bringing the heat transferred to the first heat pipe set to the thermal module via the second conducting end for dissipation.

4. The heat dissipation arrangement for a communication chassis as claimed in claim 1, wherein the first heat pipe set includes a plurality of first heat pipes, each of the first heat pipes having a first heat absorbing end and a first heat dissipating end; the first heat absorbing ends being closer to the at least one first raised area while the first heat dissipating ends being farther away from the at least one first raised area.

5. The heat dissipation arrangement for a communication chassis as claimed in claim 1, wherein the heat dissipation portion comprises:
   a first heat dissipation sections;
   a second heat dissipation sections;
   a third heat dissipation sections;
   a fourth heat dissipation section;
   a fifth heat dissipation section;
   the first to the fifth heat dissipation section being connected to one another to form a cold zone; and
   the first heat dissipation section being a section on a bottom of the receiving space located distant from the heat receiving portion, and the second to the fifth heat dissipation section being successively connected together to locate around the receiving space.

6. The heat dissipation arrangement for a communication chassis as claimed in claim 1, wherein the chassis body is provided in the receiving space with at least one groove, into which the first heat pipe set is received; a part of the at least one groove being located adjacent to the at least one first raised area and around the heat receiving portion, and the remaining part of the at least one groove being located adjacent to the heat dissipation portion and around the chassis body.

7. The heat dissipation arrangement for a communication chassis as claimed in claim 1, wherein the chassis body is provided on an outer surface opposite to the receiving space with a plurality of radiating fins.

8. The heat dissipation arrangement for a communication chassis as claimed in claim 1, further comprising:
   a third heat pipe set arranged on the heat-conducting element;
   the third heat pipe set including a plurality of third heat pipes, each of the third heat pipes having a third heat absorbing end and a third heat dissipating end; the third heat absorbing ends being closer to the second raised areas while the third heat dissipating ends being farther away from the second raised areas; and
   heat absorbed by the third heat absorbing ends being transferred from the third heat absorbing ends to the heat dissipation portion via the third heat dissipating ends.

9. The heat dissipation arrangement for a communication chassis as claimed in claim 8, further comprising:
   a cover connected to an open side of the chassis body;
   the cover being provided on a first face facing toward the receiving space with at least one third raised area; and
   on an opposite second face facing away from the receiving space with a plurality of radiating fins; and the third raised area contacting with at least one heat-producing element on the at least one machine board, so that a hot zone is formed at the third raised area.

10. The heat dissipation arrangement for a communication chassis as claimed in claim 9, further comprising a fourth heat pipe set arranged on the cover; the fourth heat pipe set including a plurality of fourth heat pipes, and each of the fourth heat pipes having a fourth heat absorbing end and a fourth heat dissipating end; the fourth heat absorbing ends being closer to the third raised area while the fourth heat dissipating ends being farther away from the third raised area; and heat absorbed by the fourth heat absorbing ends being transferred from the fourth heat absorbing ends to the radiating fins on the cover and the heat dissipation portion via the fourth heat dissipating ends.

* * * * *